(12) United States Patent
Hirata et al.

(10) Patent No.: US 9,552,983 B2
(45) Date of Patent: Jan. 24, 2017

(54) MANUFACTURING METHOD FOR SEMICONDUCTOR DEVICE

(71) Applicant: NuFlare Technology, Inc., Yokohama (JP)

(72) Inventors: Hironobu Hirata, Mishima (JP); Masayoshi Yajima, Kanagawa-ken (JP); Yoshikazu Moriyama, Izu (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 14/698,031

(22) Filed: Apr. 28, 2015

(65) Prior Publication Data

US 2015/0228477 A1 Aug. 13, 2015

Related U.S. Application Data

(62) Division of application No. 12/563,602, filed on Sep. 21, 2009, now abandoned.

(30) Foreign Application Priority Data

Sep. 22, 2008 (JP) ................................ 2008-242270

(51) Int. Cl.
*H01L 21/02* (2006.01)
*C23C 16/46* (2006.01)
*H01L 21/67* (2006.01)
*H01L 21/677* (2006.01)

(52) U.S. Cl.
CPC ......... *H01L 21/02299* (2013.01); *C23C 16/46* (2013.01); *H01L 21/02164* (2013.01); *H01L 21/02236* (2013.01); *H01L 21/67109* (2013.01); *H01L 21/67751* (2013.01)

(58) Field of Classification Search
None
See application file for complete search history.

(56) References Cited

U.S. PATENT DOCUMENTS

| 5,628,829 A | 5/1997 | Foster et al. |
| 6,184,498 B1 | 2/2001 | Kiyama |
| 6,250,914 B1 | 6/2001 | Katsumata et al. |

(Continued)

FOREIGN PATENT DOCUMENTS

| JP | 6-188198 | 7/1994 |
| JP | 2002-43302 | 2/2002 |
| JP | 2003-273032 | 9/2003 |

OTHER PUBLICATIONS

Notification of Reason(s) for Refusal issued by the Japanese Patent Office on Feb. 7, 2012, for Japanese Patent Application No. 2008-242270, and English-language translation thereof.

*Primary Examiner* — Alexander Ghyka
(74) *Attorney, Agent, or Firm* — Finnegan, Henderson, Farabow, Garrett & Dunner LLP

(57) ABSTRACT

A manufacturing method for a semiconductor device, including: loading a wafer into a reaction chamber; placing the wafer on a push-up shaft moved up; preheating the wafer under controlling an in-plane temperature distribution of the wafer to be a recess state under a state of placing the wafer on the push-up shaft moved up; lowering the push-up shaft with the wafer kept in the recess state to hold the wafer on a wafer holding member; heating the wafer to a predetermined temperature; rotating the wafer; and supplying a process gas onto the wafer.

9 Claims, 2 Drawing Sheets

(56) References Cited

U.S. PATENT DOCUMENTS

| | | | |
|---|---|---|---|
| 6,462,310 | B1 | 10/2002 | Ratliff et al. |
| 6,596,086 | B1 | 7/2003 | Honma et al. |
| 6,596,095 | B2 * | 7/2003 | Ries .................... C23C 16/0227 117/89 |
| 2006/0127067 | A1 * | 6/2006 | Wintenberger ........... F27B 5/04 392/416 |
| 2006/0219360 | A1 | 10/2006 | Iwasaki |
| 2007/0204796 | A1 | 9/2007 | Hirata et al. |
| 2008/0032036 | A1 | 2/2008 | Ito et al. |

\* cited by examiner

MANUFACTURING METHOD FOR SEMICONDUCTOR DEVICE

CROSS-REFERENCE TO RELATED APPLICATION

This application is a divisional application of U.S. application Ser. No. 12/563,602 filed on Sep. 21, 2009, which is based upon and claims the benefit of priority from the prior Japanese Patent Application No. 2008-242270 filed on Sep. 22, 2008, the entire contents of which are incorporated herein by reference.

BACKGROUND OF THE INVENTION

The present invention relates to a manufacturing method and a manufacturing apparatus for a semiconductor device, used, for example, to perform film formation by supplying a reaction gas to a front face of a semiconductor wafer while heating the semiconductor wafer from a rear face thereof.

In recent years, a growing demand for cost reduction and higher performance of a semiconductor device requires high productivity in a film formation process of a wafer as well as high quality such as improvement in film thickness uniformity.

To meet such requirement, there has been used a technique of forming a film using a single wafer epitaxial film forming apparatus by supplying a process gas while rotating a wafer at a high speed of, for example, at least 900 rpm and heating the wafer from a rear face thereof using a heater.

In such a rear-face heating type, the following problem occurs. In loading a wafer under a room temperature state into a reaction chamber previously heated to, for example, approximately 700° C. and transferring the wafer onto a member, cooling of the central member drops the temperature of the central portion of the wafer, which results in uneven temperature. Accordingly, there has been proposed a technique of additionally heating the central member, as disclosed in Japanese Patent Application Laid-Open No. 2002-43302 ([0028] and [0029], etc.).

SUMMARY

According to an aspect of the present invention, there is provided a manufacturing method for a semiconductor device, including: loading a wafer into a reaction chamber; placing the wafer on a push-up shaft moved up; preheating the wafer under controlling an in-plane temperature distribution of the wafer to be a recess state under a state of placing the wafer on the push-up shaft moved up; lowering the push-up shaft with the wafer kept in the recess state to hold the wafer on a wafer holding member; heating the wafer to a predetermined temperature; rotating the wafer; and supplying a process gas onto the wafer.

DETAILED DESCRIPTION

Figure 1:
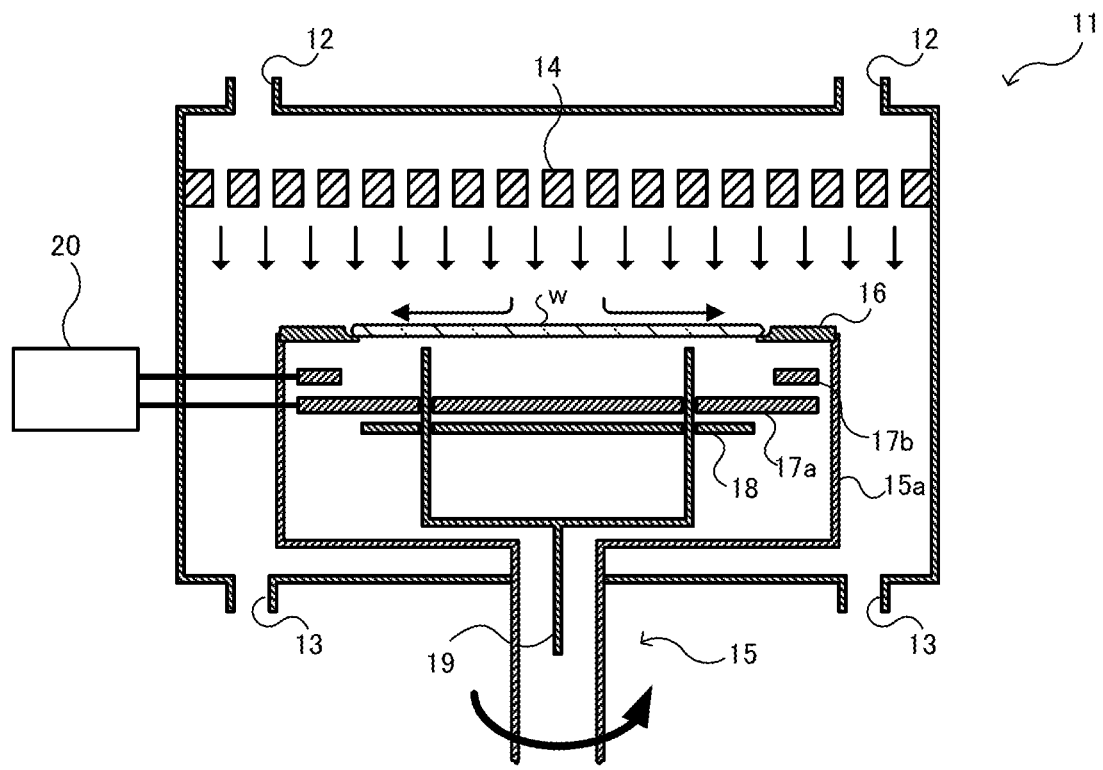
FIG. 1 is a sectional view of a manufacturing apparatus for a semiconductor device according to an aspect of the present invention.

Reference will now be made in detail to the present embodiment of the invention, an example of which is illustrated in the accompanying drawings. Wherever possible, the same reference numbers will be used throughout the drawing to refer to the same or like parts.

In loading a wafer of room temperature into a reaction chamber conditioned to a high temperature, heating of a central position of the wafer can restrain the temperature of the wafer from becoming uneven to some degree. However, in practice, it is difficult to control the temperature of a wafer to such a degree that uneven temperature does not occur in the wafer. In particular, in a case where an oxide film is formed on a rear face of a wafer, the wafer is warped due to a difference in temperature or thermal expansion coefficient between a front face and a rear face of the wafer as well as due to its own weight.

Preheating of a wafer deforms the wafer from a recess state to a protrusion state, thus causing the wafer to have a bouncing phenomenon. Such a bouncing phenomenon displaces the wafer from an ordinary position thereof and causes the wafer not to be retained in a horizontal state, thus the wafer has variations in film thickness and tends to drop off and have a fracture. Such phenomena cause problems such as degradation in yield, reliability and productivity.

According to verification by the inventors, it is found that an amount of warpage depends upon temperature. As a temperature difference between a central portion and an outer-peripheral portion of a wafer is larger, the amount of warpage from a recess state to a protrusion state becomes larger. However, as the temperature difference becomes larger above a certain level, the temperature at which the wafer is deformed from a recess state to a protrusion state also rises. In other words, when the temperature difference between the central portion and an outer-peripheral portion of a wafer becomes larger to some degree, the wafer is not deformed from a recess state to a protrusion state even if the wafer is heated to a film-formation temperature. The present invention is based on such findings.

An embodiment of the present invention will be described below with reference to the accompanying drawings.

FIG. 1 is a sectional view of an epitaxial growth apparatus that is a semiconductor manufacturing apparatus according to the present embodiment. As illustrated in FIG. 1, a reaction chamber 11 performing film formation for a wafer w of, for example, φ200 mm has a gas supply inlet 12 connected to a gas supply mechanism (not illustrated) for supplying a process gas or the like containing a source gas such as TCS or dichlorosilane onto the wafer w from a top portion of the reaction chamber 11. At a bottom portion of the reaction chamber 11, there are provided two, for example, gas outlets 13 connected with a gas discharge mechanism (not illustrated) for discharging gas and controlling the pressure in the reaction chamber 11 to be constant (normal pressure).

At an upper portion of the reaction chamber 11, there is disposed a straightening vane 14 for supplying a process gas supplied via the gas supply inlet 12 onto the wafer w in a straightened state.

At a lower portion of the reaction chamber 11, there are disposed a rotation drive mechanism 15 for rotating the wafer w, including a motor (not illustrated), a rotating shaft (not illustrated) and a ring 15a, and a susceptor 16 which is connected with the rotation drive mechanism 15 and holds the wafer w as a wafer retaining member.

Below the susceptor 16, there is disposed an in-heater 17a made of for heating a wafer w. Between the susceptor 16 and the in-heater 17a, there is disposed an out-heater 17b made of SiC and the like for heating a peripheral portion of a wafer w. Below the in-heater 17a, there is disposed a disc-shaped reflector 18 for efficiently heating a wafer w. There is also disposed a push-up shaft 19 which is arranged so as to penetrate through the in-heater 17a and the reflector 18 and which raise and lower a wafer w.

The in-heater 17a and the out-heater 17b are connected to a temperature control mechanism 20 together with a temperature sensor (not illustrated) which is disposed at a lower portion of the straightening vane, for example, and which detects the temperature at a central portion and an outer-peripheral portion of a wafer w. The temperature control mechanism 20 controls the temperature of each heater so that the temperature difference is at least a critical temperature difference (threshold value) that does not cause a wafer w to be deformed from a recess state to a protrusion state until the temperature of the wafer w reaches a preset reached temperature (e.g., 1,100° C.).

Using such a manufacturing apparatus for a semiconductor device, a Si epitaxial film is formed on a φ200 mm wafer w having a rear-face oxide film of, for example, 900 nm.

Figure 2:
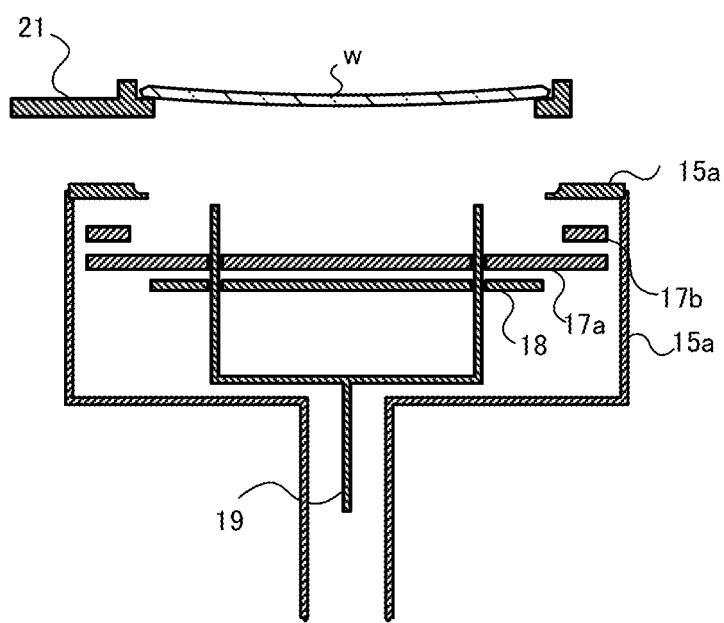
FIG. 2 is a sectional view of a manufacturing process of a semiconductor device according to an aspect of the present invention.

First, as illustrated in FIG. 2, a gate (not illustrated) of the reaction chamber 11 is opened, and a wafer w is loaded into the reaction chamber 11, the inside of which is heated to 700° C., for example by a robot hand 21. At this time, the wafer w is uniform in temperature distribution and is in a state slightly recessed by its own weight.

Next, the push-up shaft 19 is moved up, the wafer w is placed on the push-up shaft 19, the robot hand 21 is unloaded to the outside of the reaction chamber 11 and the gate (not illustrated) is closed. A gas, such as $H_2$ gas, which does not contribute to film formation alone, is introduced into the reaction chamber 11 through the gas supply inlet 12 from the gas supply mechanism (not illustrated). $H_2$ gas at room temperature is introduced onto the wafer wand convected inside the reaction chamber 11 and hence the temperature, particularly at the central portion of the wafer w, lowers.

Figure 3:
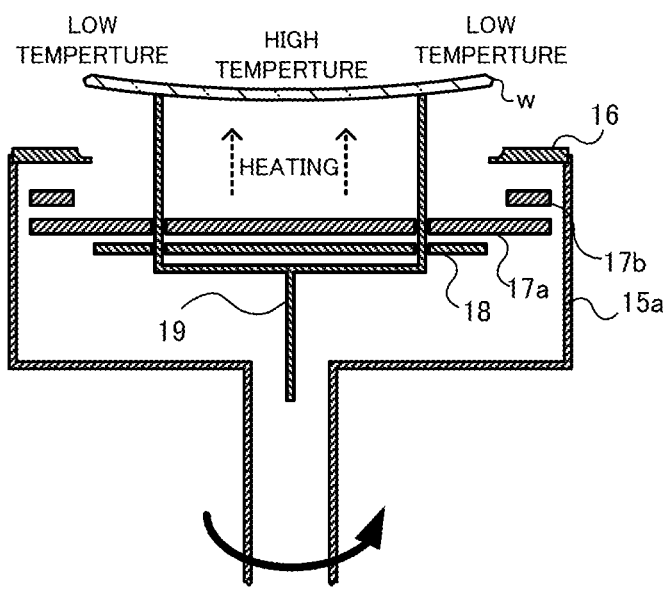
FIG. 3 is a sectional view of a manufacturing process of a semiconductor device according to an aspect of the present invention.

Accordingly, as illustrated in FIG. 3, preheating is conducted by controlling the in-plane temperature distribution of the wafer by the temperature control mechanism 20 such that the temperature at the central portion thereof becomes higher. For example, the temperature distribution is controlled by turning on the in-heater 17a and turning off the out-heater 17b, so that a critical temperature difference which does not cause the wafer to be deformed into a protruding state even when the wafer w is heated to a reached temperature of, for example, 1,100° C.

In this case, the critical temperature difference can be determined based on a relationship between the temperature and the amount of displacement due to the difference in temperature between a central portion and an outer-peripheral portion when the wafer w is heated to a predetermined temperature. Description will be made below on a case where a φ200 mm and 0.725 mm thick wafer w having an 800 nm thick rear-face oxide film is heated from 700° C. to 1,200° C. at the central portion thereof, by way of example.

Figure 4:
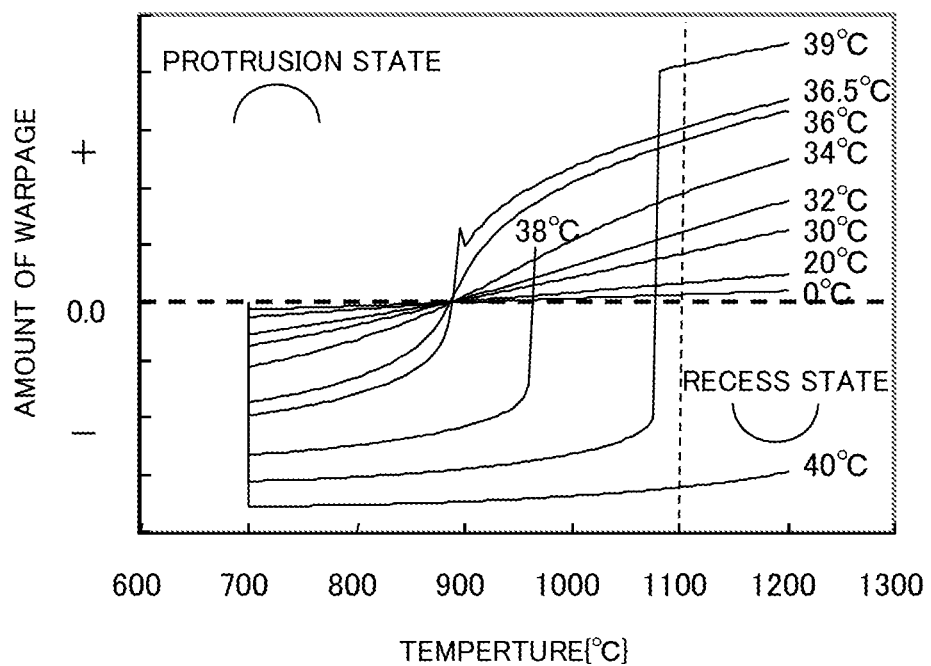
FIG. 4 is a graph illustrating a relationship between the temperature and an amount of warpage due to a temperature difference between a central portion and an outer-peripheral portion of a wafer when a wafer is heated according to an aspect of the present invention.

As illustrated in FIG. 4, when the difference in temperature between a central portion (e.g., 20 mm from the center) and an outer-peripheral portion (e.g., 90 mm from the center) is 30° C. or less, the amount of displacement is also small and the change from a recess state to a protrusion state gradually occurs at about 900° C. When the temperature difference is over 30° C. and less than 36° C., the change from a recess state to a protrusion state rapidly occur at 900° C., and when beyond 36° C., the temperature at which the change from a recess state to a protrusion state occur al so rises depending upon the temperature difference. Further, when the temperature difference is 40° C., the change from a recess state to a protrusion state does not occur even if a wafer w is heated to 1,200° C.

In this case, the temperature difference 40° C. is determined as a critical temperature difference which allows a wafer to remain in a recess state even if the wafer is heated to 1,200° C. Then, the in-plane temperature distribution of the wafer is controlled so as to have at least the critical temperature difference (40° C.).

A wafer w in which the in-plane temperature distribution is controlled is placed on the susceptor 16 by moving down the push-up shaft 19. To uniformly keep the in-plane temperature of the wafer w at 1,100° C., the temperature control mechanism 20 independently controls the in-heater 17a to be approximately 1,400° C. and the out-heater 17b to be approximately 1,500° C., respectively.

The rotation drive mechanism 15 rotates the wafer w at 900 rpm, for example, and a process gas is supplied via the gas supply inlet 12 onto the wafer win a straightened state through the straightening vane 14. The process gas is prepared such that a TCS concentration is, for example, 2.5% and is supplied, for example, at 50 SLM.

On the other hand, surplus TCS, process gas including dilution gas and gas such as HCl which is a reaction by-product are exhausted from the gas outlet 13 and the pressure in the reaction chamber 11 is controlled to be constant (for example, normal pressure), and a Si epitaxial film is grown on the wafer w.

In this way, after the wafer w is loaded into the reaction chamber 11, preheating is conducted by controlling the temperature difference between a central portion and an outer-peripheral portion of a wafer w to be larger than the critical temperature difference such that the wafer w is kept in a recess state. Such preheating restrains a bouncing phenomenon of the wafer to uniformly perform film formation on the wafer and inhibit degradation in yield and productivity, thus attaining high reliability of a semiconductor device.

In the present embodiment, the wafer w is placed directly on the push-up shaft 19 in loading the wafer w and preheating of the wafer. However, the wafer w may be placed above the push-up shaft with a susceptor disposed therebetween. In this case, the susceptor may be of a split type, the wafer w may be placed on a component constructing a susceptor.

According to the present embodiment, a film such as an epitaxial film can be formed on a semiconductor wafer with high productivity. In addition, the yields of wafers and semiconductor devices manufactured through an element formation process and an element separation process can be improved and stable element characteristics of the semiconductor devices can be obtained. In particular, by applying to an epitaxial formation process of power semiconductor devices such as power MOSFET and IGBT, which require growth of a thick film having a thickness of 100 μm or more in an N-type base region, P-type base region or an insulation isolation region, satisfactory element characteristics can be obtained.

While the epitaxial film is formed on an Si substrate in this embodiment, it can be applied to forming of a polysilicon layer and it can be applied also to other compound semiconductors, for example, a GaAs layer, a GaAlAs layer, and an InGaAs layer. It can also be applied to forming of an $SiO_2$ film and an $Si_3N_4$ film, and in the case of $SiO_2$ film, monosilane ($SiH_4$) and gases of $N_2$, $O_2$, and Ar are fed, and in the case of $Si_3N_4$ film, monosilane ($SiH_4$) and gases of $NH_3$, $N_2$, $O_2$, and Ar are fed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method for a semiconductor device, comprising:
    loading a wafer into a reaction chamber;
    placing the wafer on a push-up shaft moved up;
    preheating the wafer with controlling that a temperature of a central portion of the wafer becomes higher than a temperature of an outer-peripheral portion of the wafer, and that a difference between the temperature of the central portion of the wafer and the temperature of the outer-peripheral portion of the wafer becomes more than a critical temperature difference allowing the wafer to remain in a recess state until the wafer is heated to a film formation temperature of more than 900 degrees Celsius under a state of placing the wafer on the push-up shaft moved up;
    lowering the push-up shaft with the wafer kept in the recess state to hold the wafer on a wafer holding member;
    heating the wafer to the film formation temperature;
    rotating the wafer; and
    supplying a process gas onto the wafer to form a film on the wafer,
    wherein the critical temperature difference is determined preliminarily based on a relationship between a temperature in the reaction chamber and an amount of displacement due to the difference between the temperature of the central portion of the wafer and the temperature of the outer-peripheral portion of the wafer when the wafer is heated to a predetermined temperature.

2. The manufacturing method according to claim 1, wherein a difference between temperatures of the central portion and the outer-peripheral portion of the wafer is at least 40° C.

3. The manufacturing method according to claim 1, wherein an oxide film is formed on a rear face of the wafer.

4. The manufacturing method according to claim 1, wherein the wafer is in the recess state when the wafer is placed on the push-up shaft.

5. The manufacturing method according to claim 1, wherein the wafer is placed above the push-up shaft with at least a part of a wafer holding member disposed between the wafer and the push-up shaft.

6. The manufacturing method according to claim 1, wherein a process gas not contributing to film formation alone is supplied under the state of placing the wafer on the push-up shaft moved up.

7. The method for manufacturing a semiconductor device according to claim 1, wherein the process gas is supplied onto the wafer in a straightened state.

8. The manufacturing method according to claim 1, wherein an inside of the reaction chamber is controlled to be at a normal pressure.

9. The manufacturing method according to claim 1, wherein an oxide film is formed on a rear face of the wafer and a temperature of a central portion of the wafer is controlled to be higher than a temperature of an outer-peripheral portion of the wafer by at least 40° C. to retain the wafer in a recess state in the preheating.

* * * * *